United States Patent [19]

Ayata et al.

[11] Patent Number: 4,719,357
[45] Date of Patent: Jan. 12, 1988

[54] SEMICONDUCTOR CIRCUIT MANUFACTURING APPARATUS HAVING SELECTIVELY OPERABLE DETECTORS FOR EFFECTING AUTOMATIC ALIGNMENT

[75] Inventors: Naoki Ayata, Machida; Tadashi Konuki, Tokyo; Masao Kosugi, Yokohama, all of Japan

[73] Assignee: Canon Kabushiki Kaisha, Tokyo, Japan

[21] Appl. No.: 8,134

[22] Filed: Jan. 22, 1987

Related U.S. Application Data

[63] Continuation of Ser. No. 633,347, Jul. 23, 1984, abandoned.

[30] Foreign Application Priority Data

Aug. 1, 1983 [JP] Japan ................. 58-140896
Aug. 18, 1983 [JP] Japan ................. 58-151024
Nov. 10, 1983 [JP] Japan ................. 58-209940
Nov. 10, 1983 [JP] Japan ................. 58-209941

[51] Int. Cl.⁴ ............................................. G01B 11/27
[52] U.S. Cl. ................................. 250/548; 356/400; 364/559
[58] Field of Search ................ 250/548, 557; 356/399–401; 355/55, 77, 86, 95, 132; 364/559, 490, 491

[56] References Cited

U.S. PATENT DOCUMENTS

4,315,201  2/1982  Suzuki et al. .......... 356/400
4,328,553  5/1982  Fredriksen et al. ...... 356/400
4,362,385  12/1982 Lobach ................ 250/548
4,515,481  5/1985  Yamada et al. ......... 356/401

FOREIGN PATENT DOCUMENTS

0020832A  6/1979  European Pat. Off. .
0041870A  12/1981 European Pat. Off. .
0066321A  12/1982 European Pat. Off. .
1577025  10/1908 United Kingdom .
1022111  3/1966  United Kingdom .
2039030A  7/1980  United Kingdom .
2040444A  8/1980  United Kingdom .
2045523A  10/1980 United Kingdom .
2073950A  10/1981 United Kingdom .
2075182A  11/1981 United Kingdom .
2098319A1 11/1982 United Kingdom .
2112933A  7/1983  United Kingdom .
2139348A2 11/1984 United Kingdom .

*Primary Examiner*—Edward P. Westin
*Attorney, Agent, or Firm*—Fitzpatrick, Cella, Harper & Scinto

[57] ABSTRACT

A semiconductor circuit manufacturing apparatus wherein a wafer has a plurality of zones to be exposed one by one to a pattern of a mask, including detector apparatus for detecting a relative position between the mask and a said zone to be exposed and producing outputs representative of the relative position; a device for exposing the said zone to the mask pattern after they are aligned; a device for producing information for identifying said zone which is going to be exposed; a selector, responsive to said information producing device, for selecting all or a part of the outputs of said detecting apparatus; and a device for determining, on the basis of the selected outputs of said detecting apparatus, a positional deviation between the mask pattern and the zone to be exposed thereto.

13 Claims, 17 Drawing Figures

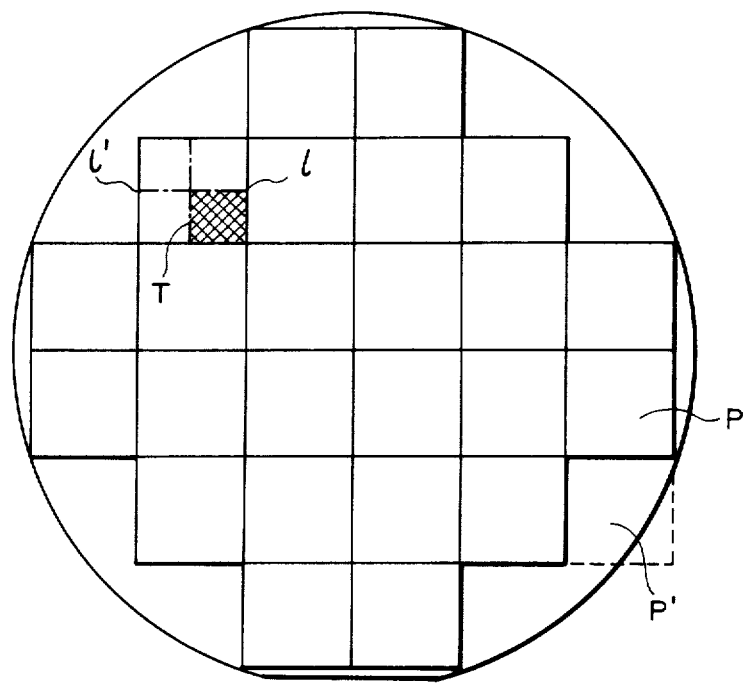
F I G. 1

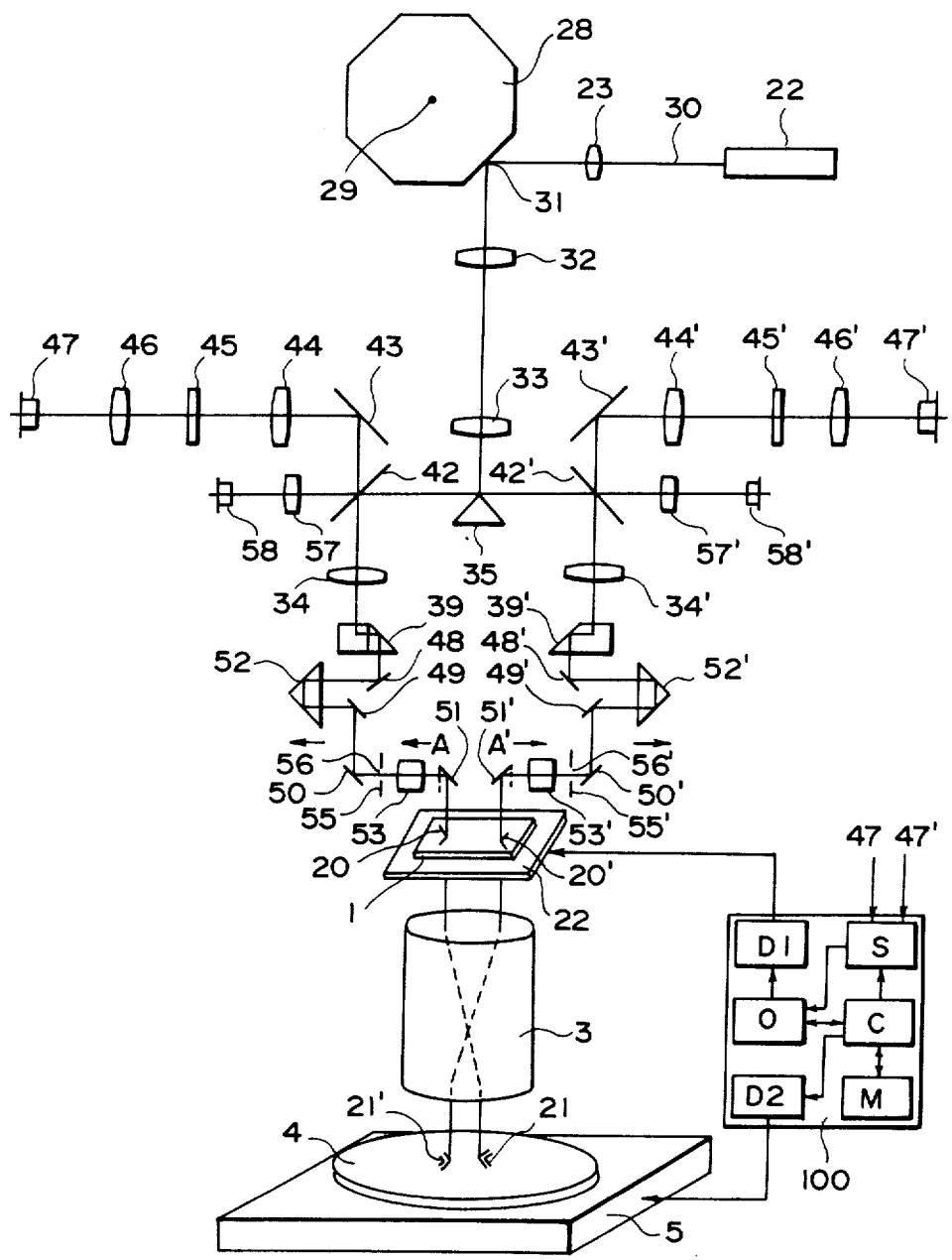
F I G. 9

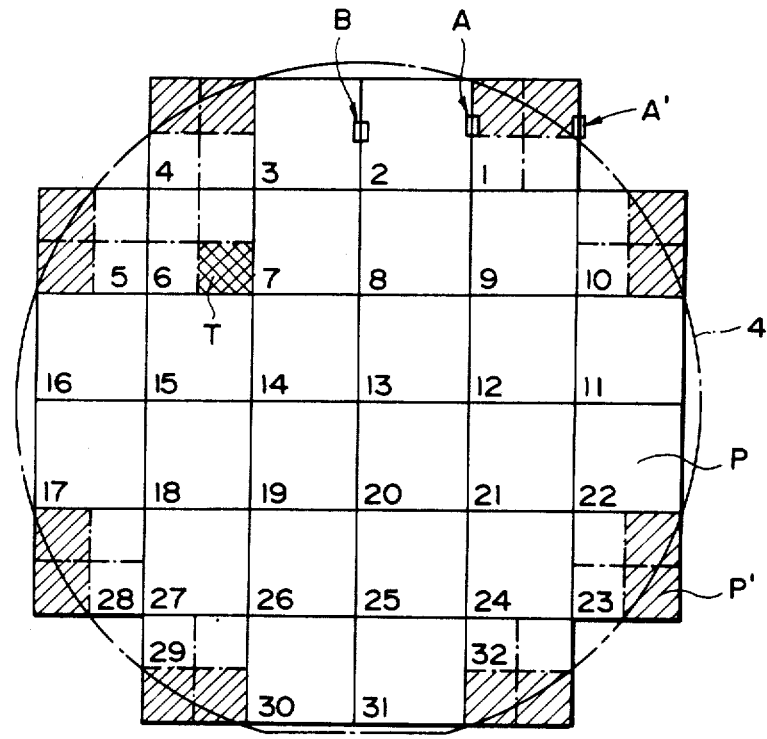
F I G. 12

SEMICONDUCTOR CIRCUIT MANUFACTURING APPARATUS HAVING SELECTIVELY OPERABLE DETECTORS FOR EFFECTING AUTOMATIC ALIGNMENT

This application is a continuation of application Ser. No. 633,347 filed July 23, 1984, now abandoned.

BACKGROUND OF THE INVENTION

The present invention relates to a semiconductor manufacturing apparatus wherein a wafer is aligned with a photomask or a reticle (hereinafter will be called simply "mask").

As one of the systems for aligning a mask and a wafer in a step-and-repeat type semiconductor circuit manufacturing apparatus, a TTL (through the lens) type die-by-die alignment system is known wherein the mask is aligned with each of the regions of the wafer through a projection lens for each of the shots. This system is advantageous in that the alignment operation is carried out for each of the shots so that a highly accurate alignment can be achieved.

Conventionally, in this type of system, two or more detecting means are located at different positions in order to detect the positional deviation between the mask and the wafer in X-direction, Y-direction and $\theta$-direction (rotation). The mask and the wafer are placed into alignment with each other by the relative movement between them in response to the outputs of the detecting means.

In order to allow the detection of the positional relation between the mask and the wafer, they are provided with alignment marks. To save the space for those marks, such an alignment mark is often formed on a scribe line between chips or between zones, each of which is covered by a single shot (it is possible that one shot covers plural chips). This arrangement of the alignment marks involves a problem that, depending on the arrangement of the zones or shots, an automatic alignment operation cannot be effected on the basis of mark detections at plural different positions. Even if the alignment mark is located in the zone covered by a single shot, the same problem can occur. Therefore, there has been a problem that the arrangement which enables an automatic alignment results in the increase of the number of invalid zones, and therefore, the decrease of the number of the valid chips obtained from one wafer.

FIG. 1 shows an example of a zone or shot arrangement on a wafer. A zone P is the area covered by a single shot, that is, exposed by a single shot. In this example, four chips T are exposed by a single exposure shot. In the zone P, orthogonal scribe lines 1 and 1' are provided, and alignment marks are formed in the middle thereof.

It will be understood that the zone indicated by a referece numeral P' is void of a wafer alignment mark to be detected by a left-hand side view field of the detection optical system, so that the positional deviation can not be detected. Therefore, the automatic alignment operation can not be carried out between the mask and this zone P' of the wafer. As a result, this zone P' has to be an invalid zone.

After the automatic alignment between the mask and the wafer is accomplished, the wafer is exposed to a pattern of the mask so that the pattern is printed on the wafer, the wafer is then subjected to an etching and other operations for forming semiconductor circuits, during which the alignment marks can be damaged or partially failed. The partial failure or damage obstructs the production of proper alignment signals so that the zone having such an alignment mark can not be aligned. When this occurs, the apparatus gives up such a shot and advances to the next shot. This is disadvantageous in that the time required for attempting to detect the alignment mark has to be spent, more importantly, the chips in such a zone become rejects. In addition, there is a problem of pitch error caused by, for example, a reduction or an expansion of the wafer. This results in positional deviation between the wafer and the mask, which can not be obtained from the detection of only a part of the plural alignment marks (one of the alignment marks or one half of each of the alignment marks).

Furthermore, there is a problem of a particular positional deviation between the wafer and the mask (for example, rotational deviation), which can not be obtained by the detection of only a part of the plural alignment marks (one of the alignment marks or one half of each of the alignment marks).

SUMMARY OF THE INVENTION

Accordingly, it is a principal object of the present invention to provide an apparatus wherein a mask and a photosensitive member can be aligned even at such a zone at which the alignment therewith has been difficult.

According to an embodiment of the present invention to accomplish this object, a semiconductor circuit manufacturing apparatus wherein the mask and the wafer are automatically aligned on the basis of the outputs from plural position detecting means for detecting the relative position therebetween, and wherein all or only a part of the position detecting means are selectively operated in accordance with the information of the zone of the wafer which is going to be shot or exposed, so that they are aligned on the basis of the outputs only of the detecting means which are operating.

It is another object of the present invention to provide an apparatus wherein, even if an alignment mark has a deficit, the alignment can be accomplished on the basis of the other alignment marks or a valid portion of the alignment mark.

According to an embodiment of the present invention to accomplish this object, an apparatus is provided wherein objects each having plural alignment marks, each of which, in turn, has a single or plural alignment mark portions, are detected, and they are automatically aligned on the bases of the detection signals, the apparatus comprising means for detecting whether each of the detection signals is proper or not and means for effecting alignment on the basis of the detection signals provided by the alignment mark portions corresponding to the signals which have been discriminated as being proper by the discriminating means.

It is a further object of the present invention to provide a semiconductor circuit manufacturing apparatus wherein the accuracy of the alignment operation is increased in the case where only a part of alignment marks are used.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a plan view of a wafer illustrating an arrangement of the zones of the wafer to be shot.

FIG. 9 illustrates a general arrangement of a semiconductor circuit manufacturing apparatus according to third and fourth embodiments of the present invention.

FIG. 12 is a plan view of the wafer showing an arrangement of the zones to be shot.

DESCRIPTION OF THE PREFERRED EMBODIMENTS

Preferred embodiments of the present invention will now be described in detail in conjunction with the accompanying drawings.

Figure 2B:
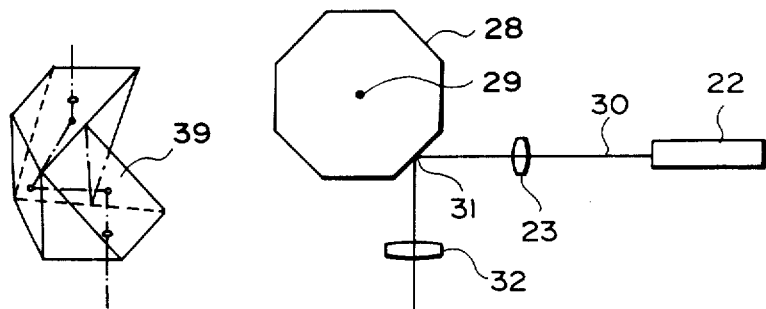
FIG. 2B is a perspective view of an element used in the apparatus shown in FIG. 2A.
Figure 2A:
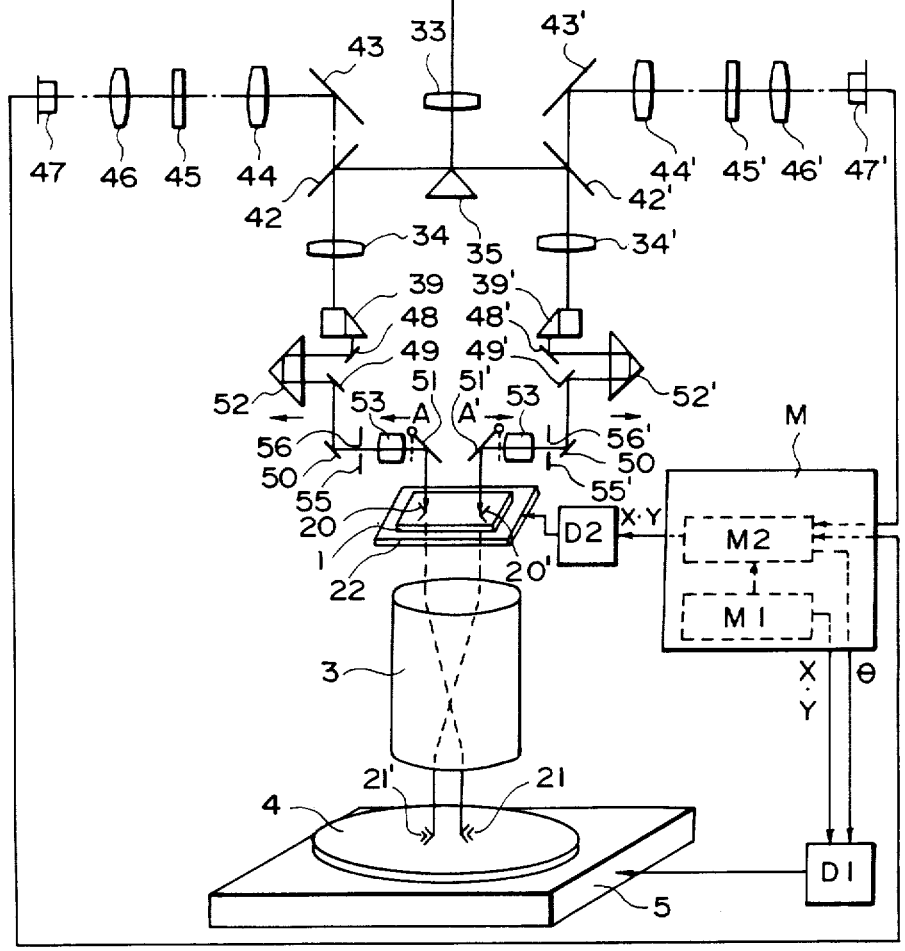
FIG. 2A illustrates a general arrangement of an apparatus according to an embodiment of the present invention.

Referring to FIG. 2A, there is shown an optical arrangement of the semiconductor circuit manufacturing apparatus according to an embodiment of the present invention. A mask 1 is provided with an integrated circuit pattern and alignment marks and supported on a mask stage 22 which is translatable and rotatable. The semiconductor circuit manufacturing apparatus comprises a reduction projection lens 3. A wafer 4 is provided with a photosensitive layer and alignment marks and supported on a wafer stage 5. The wafer stage 5, as well as the mask stage 22, is translatable in a plane (X-direction and Y-direction) and rotatable in the plane ($\theta$-direction). For example, the stepping operation can be effected by driving the wafer stage 5 which is controlled by a zone memorizing and controlling part M1 of a microprocessor M, whereas the correct setting of the mask 1 in the apparatus is effected by driving the mask stage 22 in the X-direction, Y-direction and $\theta$-direction. The alignment between the mask 1 and wafer 4 are controlled by a selection, processing and controlling part M2. It is one possible method that the mask stage 22 is driven to correct a translational deviation between the mask 1 and wafer 4, while the wafer stage 5 is driven to correct the rotational deviation. It is possible, however, that both of the deviations are corrected by driving the wafer stage 5.

The mask 1 is provided with alignment marks 20 and 20'. And, the wafer 4 is provided with alignment marks 21 and 21'. Normally, the alignment error or deviation in X-direction, Y-direction and $\theta$-direction between the mask 1 and the wafer 4 is determined on the basis of the signals detected by both of the right-hand and left-hand detection systems. In response to the results of the detection, the wafer stage 5 and or mask stage 22 are driven.

The alignment marks 20, 20', 21 and 21' on the mask 1 and wafer 4, when a projection optical system, which is not a unit magnification projection optical system, is provided therebetween, are dimensioned such that one has the same size as the other when the one is projected therethrough to the other, whether the projection is one direction or the other through the projection lens. Since, in this embodiment, a reduction projection lens is employed, the value obtained by dividing the dimension of the mask alignment mark by that of the wafer alignment mark is equal to the magnification (reduction) of the reduction projection lens.

A polygonal mirror 28 is rotatable about a rotational axis 29. A laser beam generated by a laser source 22 is condensed on a point 31 on a mirror surface of the polygonal mirror 28 by the lens 23. There are provided intermediate relay lenses 32, 33 and 34. A triangular prism 35 is so positioned that the apex thereof is right on the optical axis, so that one scan by the polygonal mirror is divided into the right side and left side. A scanning direction changing prism 39 is effective to change the scanning deflection in the direction within the plane of the drawing to the scanning deflection in the direction perpendicular to the sheet of the drawing. FIG. 2B shows an example of the scanning direction changing prism 39. A half mirror 42 is effective to introduce the beam toward a photoelectric detection signal including a mirror 43, a lens 44, a spatial frequency filter 45, a condenser lens 46 and a photodetector 47. Designated by reference numerals 48, 49, 50 and 51 are all full-mirrors; 52, a prism; 53, an f-$\theta$objective lens.

The foregoing explanation of FIG. 2A has been made only with respect to the left-hand part of the optical system, since the right-hand part is symmetric therewith. The explanation thereof will be omitted for the sake of simplicity by giving the same reference numerals but with primes to the corresponding elements.

The intermediate lenses 32, 33 and 34 are effective to image the origin of deflection of the beams deflected by the rotating polygonal mirror 28 on a pupil 56 in the position 55 of a stop of the objective lens 53. Therefore, the laser beam scans the mask 1 and wafer 4 in accordance with the rotation of the polygonal mirror 28.

In the objective lens system, the objective lens 53, the aperture stop 55, the mirror 51 and the prism 52 are movable in the X-direction and Y-direction by an unshown moving means so that the detecting position for the mask 1 and the wafer 4 can be changed. For example, as for the movement in the X-direction, when the mirror 51 moves in the direction indicated by the arrow A, the objective lens 53 and the aperture stop 55 also move in the same direction, and the prism 52 moves in the same direction but through an amount of movement which is ½ of the movement of the mirror 51 to keep the optical length constant.

Those movements are effective to allow the detection of mask setting marks provided outside the alignment marks. In addition, they are effective when the displacement or deviation of the mask is so large that the alignment mark has to be searched. The movement in the Y-direction for such a purpose is such that the entire optical system for the position detection is moved in the Y-direction (perpendicular to the sheet of the drawing).

The detection optical system is shown as using a spot beam or a beam having a sheet-like crosssection to scan the alignment marks, and as receiving the light reflected by the marks by respective photocells. However, the alignment marks may be uniformly illuminated, and images of the alignment marks are scanned by respective slits. Also, it is possible that the images of the left-hand and right-hand mark images are introduced to a single photoelectric transducer, and they are detected on the basis of time sharing. During the exposure operation, the mirror 51 is inclined to put it out of the optical path, and the illumination beam is applied by an unshown illumination optical system.

Figure 3A:
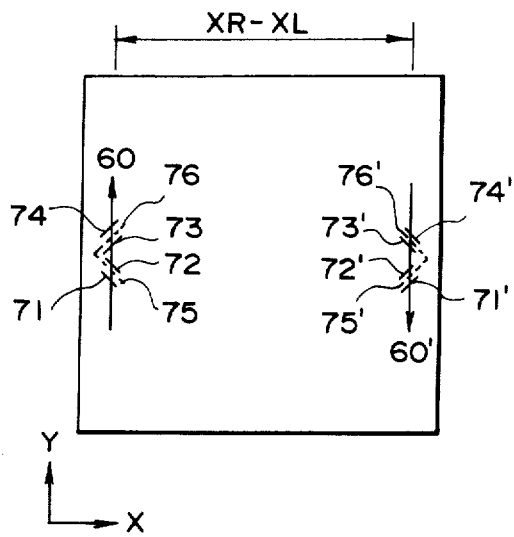
FIG. 3A is a plan view of a mask illustrating alignment marks formed thereon.

FIG. 3A shows an example of the alignment marks (solid lines) formed on the mask plane. The shown configurations of the alignment marks or the configuration analogous thereto is preferable because the positional deviations in X-direction and Y-direction can be detected by a single scan in a single direction.

Mask alignment marks 75 and 76 are formed at such a position as corresponds to the position shown by the reference numeral 20 of FIG. 2A. And, mask alignment marks 75′ and 76′ are formed at such a position as corresponds to the position shown by the reference numerals 20′ in FIG. 2A.

The alignment marks 21 and 21′ on the wafer as shown in FIG. 2A, can be projected in a reverse direction through the projection lens onto the mask 1. The marks indicated by the reference numerals 71, 72, 73, 74, 71′, 72′, 73′ and 74′ are those marks projected back from the wafer alignment marks.

Figure 3B:
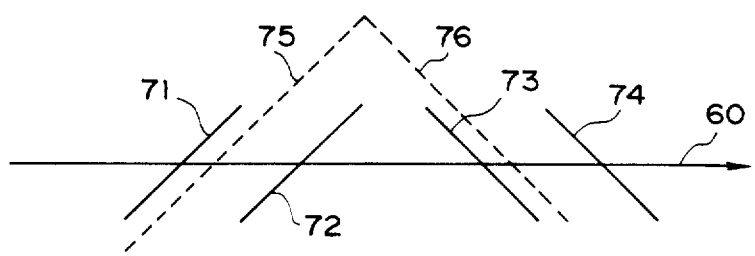
FIG. 3B is a plan view of the alignment marks.

The laser beam makes the scanning movement as shown by the arrows indicated by reference numerals 60 and 60′, as shown in the FIG. 3A. More particularly, at the left-hand side detection system, it moves in the Y-direction from the bottom side to the top side, while, in the right-hand side detection system, it moves minus Y-direction, that is, from the top to the bottom, thus scanning the respective marks. FIG. 3B is an enlarged view of the marks to be detected by the left-side detection system of FIG. 3A.

Figure 3C:
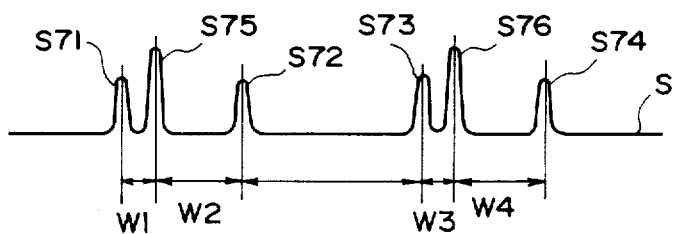
FIG. 3C shows an example of output signals produced when the alignment marks shown in FIG. 3B is scanned.

When the marks shown in FIG. 3B are scanned by the laser beam 60, the photodetectors 47 and 47′ produces the signals S71–S76 as shown in FIG. 3C. The signals S71, S72, S73 . . . correspond to the alignment marks 71, 72, 73, . . .

By measuring intervals W1, W2, W3 and W4 which are the intervals between the detection signals S71. S75, S72, S73, S76 and S74, the deviation or displacement between the mask 1 and the wafer 4 can be detected. More particularly, the deviations in X-direction and Y-directions $\Delta XL$, $\Delta YL$ obtained by the left-hand side detection system are, $$\Delta XL = (W1 - W2 - W3 + W4)/4 \quad (1)$$

$$\Delta YL = (W1 - W2 + W3 - W4)/4 \quad (2)$$

The deviations $\Delta XR$ and $\Delta YR$ for the right-hand side detection signal are, $$\Delta XR = (-W1' + W2' + W3' - W4')/4 \quad (3)$$

$$\Delta YR = (-W1' + W2' - W3' + W4')/4 \quad (4)$$

Therefore, the rotational deviation $\Delta\theta$ is $$\Delta\theta = (\Delta YR - \Delta YL)/(XR - XL) \quad (5)$$

where
XL and XR are the distances from the center of the mask 1 to the left-hand mark and right-hand mark, and (XR−XL) is the interval between the left-hand side mark and the right-hand side mark.

The wafer stage 5 is driven for step-and-repeat movements by the driving circuit D1 in response to the instruction signals provided by the step control part M1 as shown in FIG. 2A. During such step-and-repeat movements, there exists a zone of the wafer 4 where the alignment mark is out of the wafer. According to the present invention, if this occurs, the deviation is determined on the basis of the detection signals obtained only from such alignment marks that can provide proper detections by a selection, processing and control part M2. The driving circuit D2 is operated by the results of the processing. By this, the mask stage 22 is moved finely in the X-direction and Y-direction to place the mask 1 and the wafer 4 into alignment with each other. That is, when the alignment is effected only on the basis of the marks on one side, the relative position between the mask 1 and the wafer 4 is changed only in translational movement, without the correction of the rotational movement, to correct the deviations $\Delta X$ and $\Delta Y$ obtained from the direction at the one side.

The desired accuracy of the alignment may be obtained without the correction of the rotational deviation, because the rectilinearity of the wafer stage movement is improved by the recent improvements in the materials, the machining and the assembling. However, more importantly, it is particularly noted that the step-and-repeat apparatus is characterized by the small exposure area for one shot so that the possible influence by the rotational deviation is remarkably small.

Figure 4:
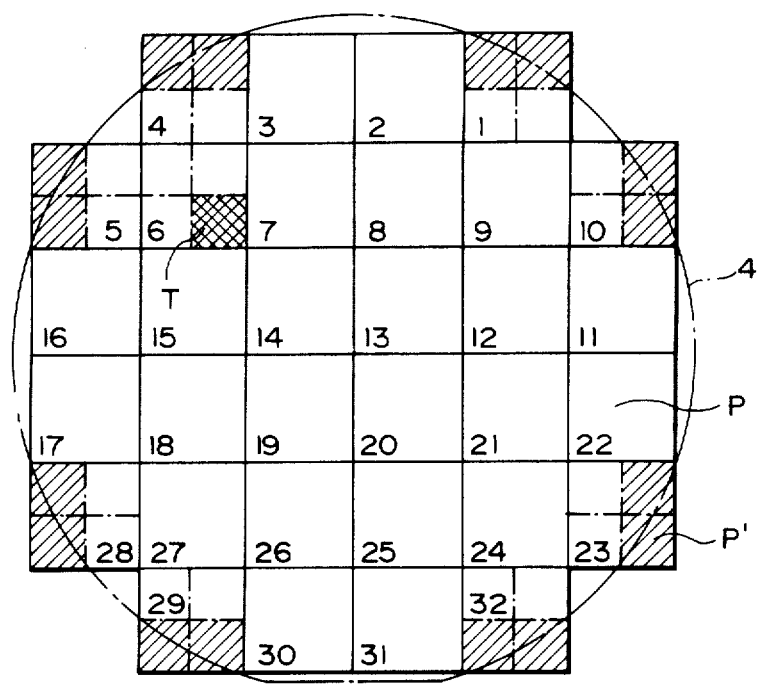
FIG. 4 is a plan view of a wafer used with an embodiment of the present invention, showing an arrangement of the zones.

FIG. 4 shows an arrangement of zones on the wafer 4, on which zone or shot numbers for the respective zones or shots are indicated. Of those zones, the following zones are aligned with the use of both of left-hand and right-hand detection systems:

2, 3, 6, 7, 8, 9, 11, 12, 13, 14, 15, 16, 17, 18, 19, 20, 21, 22, 24, 25, 26, 27, 30, 31

The zones aligned with the use of the left-hand detection system only (right-hand mark) are:
4, 5, 28, 29

The zones aligned with the use of the right-hand detection system only (left-hand mark) are:
1, 10, 23, 32

The hatched chips shown in FIG. 4 are invalid chips, but it should be noted that two chips in one zone are made valid. As compared with the number of valid chips, that is, 96, in the conventional arrangement as shown in FIG. 1, they can be increased by the FIG. 4 arrangement to 112.

Figure 5:
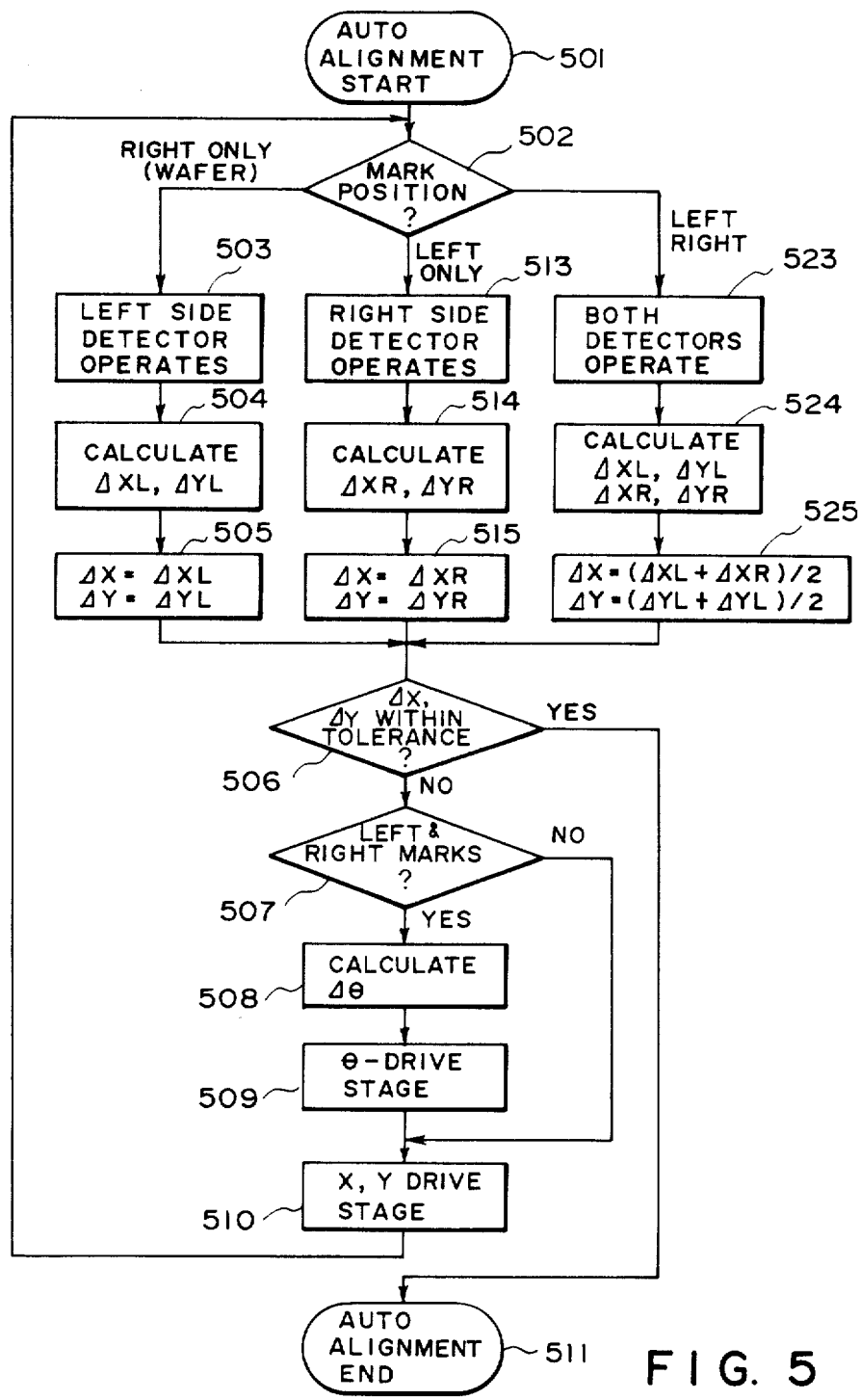
FIG. 5 is a flow chart showing the automatic alignment operation according to the embodiment of the present invention.
Figure 6A:
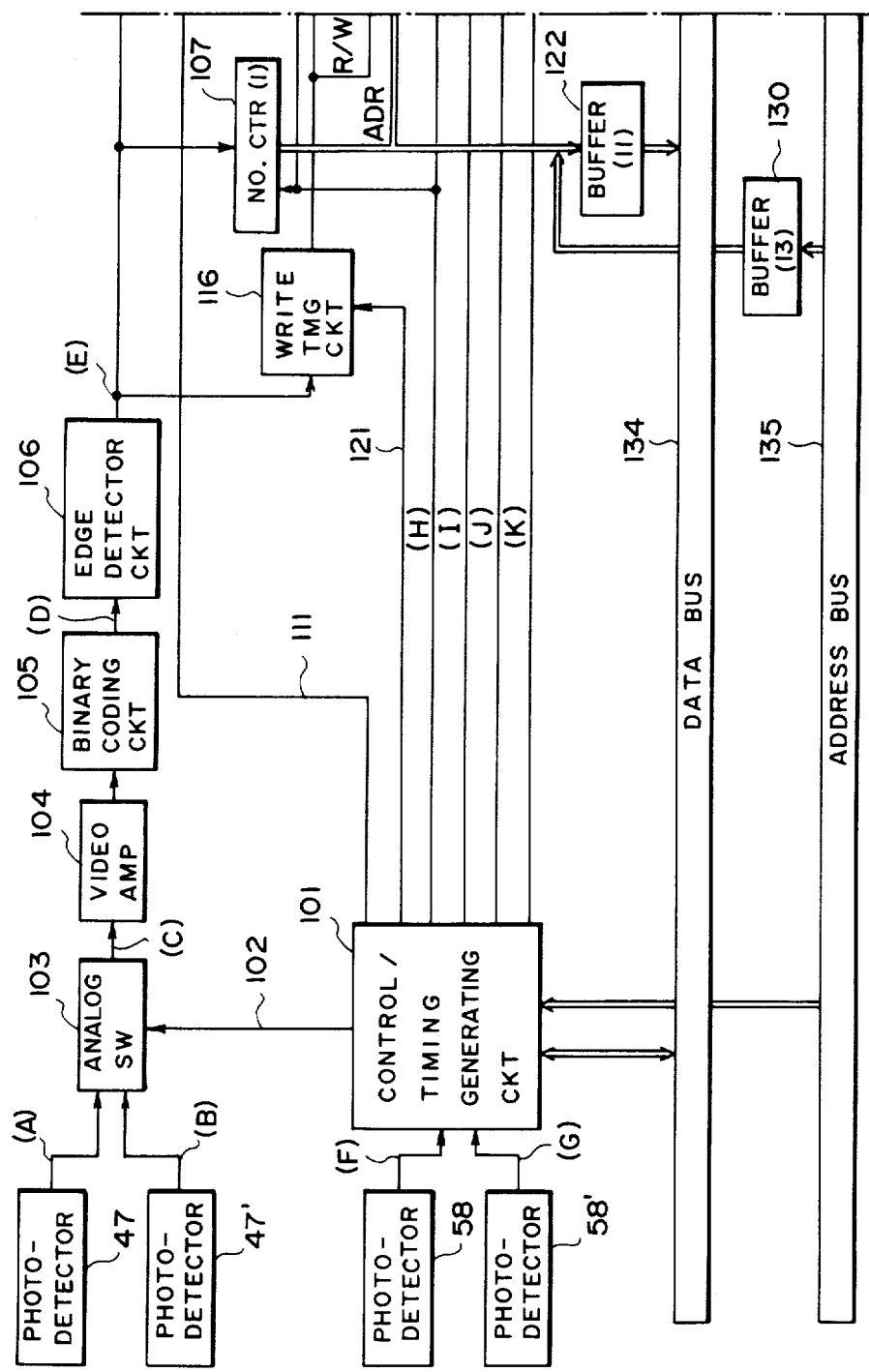
Figure 6B:
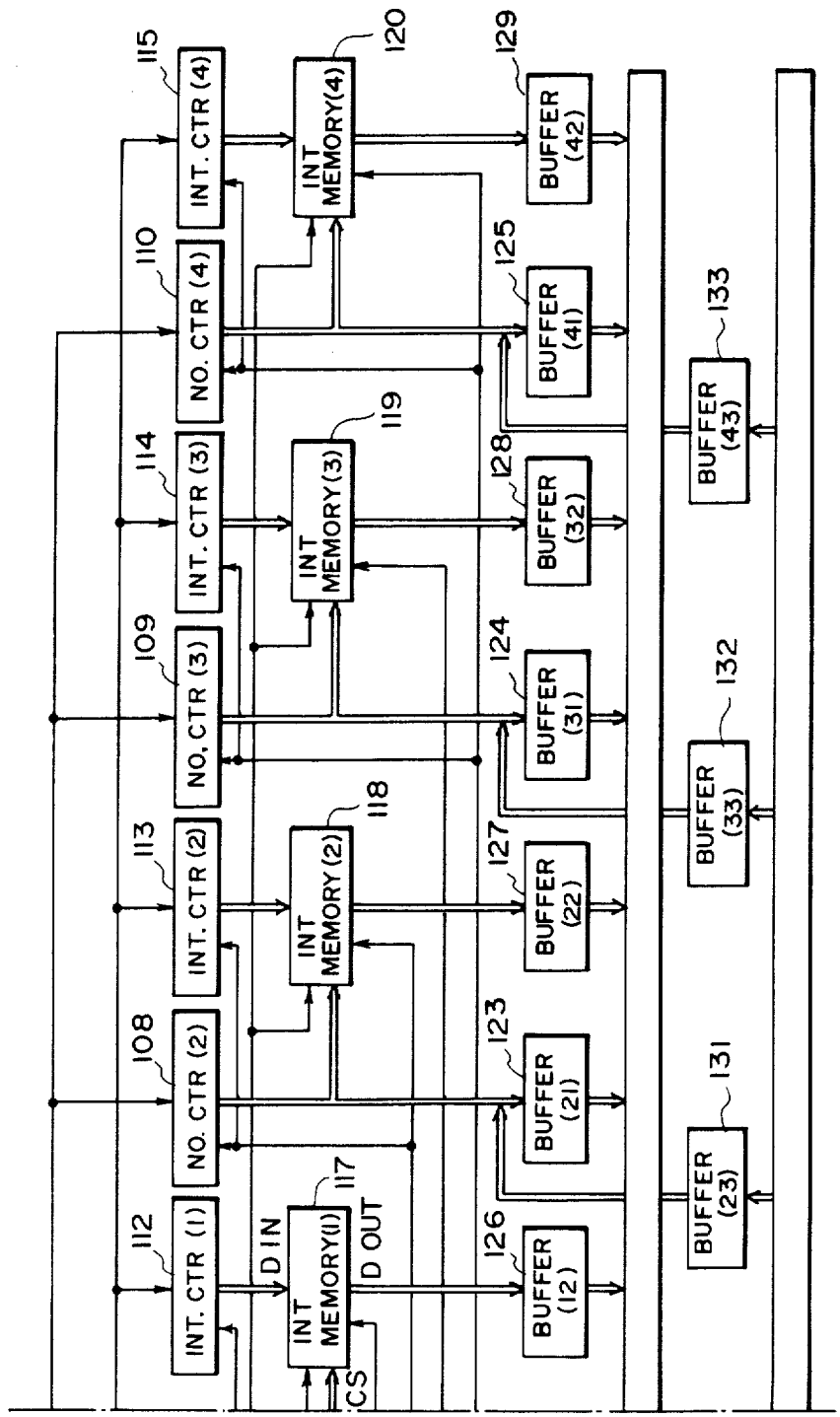

FIG. 5 shows the automatic alignment operation sequence of the apparatus according to the embodiment of the present invention. The automatic aligment starts at step 501. At step 502, positions of the alignment marks are discriminated on the basis of the shot number. As explained with the arrangement shown in FIG. 4, the positions of the usable alignment marks are predetermined in accordance with the shot number. These corresponding relations are stored in a microprocessor memory as a table. The microprocessor, therefore, discriminates the shot number on the basis of the mark position table, and advances the sequence to step 503 when the shot, that is, the zone to be aligned, is to be aligned by the right-hand mark only, to step 513 when it is to be aligned by the left-hand mark only, or to step 523 when both marks are to be used.

At steps 503, 513 and 523, the detecting operations are performed with the use of the left-hand detection system, the right-hand detection system and both detection systems, respectively. After the detections are accomplished, the positional deviation between the mask 1 and the wafer 4 are determined at steps 504, 514 and 524. At step 504, the deviation $\Delta XL$ and $\Delta YL$ are calculated from the data obtained by the left-hand detection system; at step 514, the deviations $\Delta XR$ and $\Delta YR$ are calculated from the data obtained by the right-hand detection system; and at step 524, the deviations $\Delta XL$, $\Delta YL$, $\Delta XR$ and $\Delta YR$ are calculated from the data obtained by both of the detection systems.

When both of the detection systems are used, the averages $\Delta X$, $\Delta Y$ of the X-direction deviation and Y-direction deviation, from the left-hand data and right-hand data are calculated at step 525. That is, $\Delta X = (\Delta XL + \Delta XR)/2$, $\Delta Y = (\Delta YL + \Delta YR)/2$. When, on the other hand, only one of the left-hand and right-hand detection systems is used, the deviation detected at one side is deemed as being the averages $\Delta X$ and $\Delta Y$, at step 505 and 515.

At step 506, it is discriminated whether the averages $\Delta X$ and $\Delta Y$ are within the tolerances which have been predetermined. If so, the sequence goes to step 511, and the automatic alignment operation terminates.

If not, that is, the average data of deviation are not within the tolerances, the relative positions are changed only in X-direction and Y-direction when only one detection system has been used. However, if both detection systems have been used, the relative position is changed for alignment in X-direction, Y-direction and $\theta$-direction. To do this, the discrimination is made whether both marks are used or not. If so, the sequence goes to step 508. If not, that is, only one mark is used, the sequence goes to step 510.

At step 508 (both marks) the rotational deviation $\Delta\theta$ is determined as described in the foregoing paragraph, and at step 509, the stage is driven in the $\theta$-direction. At step 510, which is common to the both-mark mode and the one-mark mode, the relative position between the mask 1 and the wafer 4 is changed to correct the deviations in the X-direction and Y-direction. Those change in the X-direction, Y-direction and $\theta$-direction may be made by the mask stage 22 or the wafer stage 5.

After the stage movement, the sequence goes back to step 502 and repeats the measurements of the intervals between marks, so that the loop sequence of steps 502 and 510 is repeated until the deviations come within the tolerances.

After the automatic alignment operation is accomplished, the full mirrors 51 and 51' for automatic alignment detection are retracted out of the optical path for the projection optical system. After the exposure shot, that is, the zone of the wafer is exposed to the pattern of the mask, the wafer stage 5 is driven to prepare for the next shot. Then, the full mirror 51 and 51' are introduced again into the projection optical path, and the automatic alignment operation is performed.

When only one side alignment mark is used, only such a full mirror that corresponds to the mark may be placed into the optical path with the other mirror kept out. In the foregoing embodiment, the information of the usable marks are obtained from the stored shot arrangement in the microprocessor, but it is a possible alternative that another photoelectric detection means is used to detect the zone of the wafer 4 and discriminate which alignment mark is usable so as to allow proper selection of the detection system.

As described in the foregoing, according to this embodiment of the present invention, even when a part of the alignment marks is not usable depending on the zones of the wafer, the alignment is possible, whereby the zones where chips could not be aligned and exposed in the conventional apparatus may be used as valid zones or chips. Thus, the number of valid chips obtainable from one wafer is increased, so that the number of products per day, for example, is remarkably increased.

Next, the second embodiment of the present invention will be described.

For the sake of explanation, each of the alignment marks shown in FIG. 3A is divided by an axis of symmetry and Xnamed as follows:
Bars 71, 72, 75 . . . a first mark portion
Bars 73, 74, 76 . . . a second mark portion
Bars 72', 73', 76'. . . a third mark portion
Bars 71', 72', 75'. . . a fourth mark portion As described with FIG. 1, the zone P covered by one shot exposure contains four chip areas so that four chips are exposed by one exposure shot. The alignment marks are provided on the scribe lines 1 and 1' which are between the exposure zones, more particularly, the first and second alignment marks portion are located at a position shown by the reference 1, and the third and fourth alignment mark portions are at the position indicated by the reference 1'.

According to this embodiment of the present invention, even in the event that one or two of the four alignment mark portions are not properly detected, the automatic alignment operation is performed, if at least two alignment mark portions are properly detected, on the basis of those mark portions.

Table 1 shows the combination of the mark portions. In this table, the detectable mark portions are indicated by "YES", and the non-detectable mark portions are indicated by "NO".

TABLE 1

| 1st Mark Portion | 2nd Mark Portion | 3rd Mark Portion | 4th Mark Portion | Combination of Mark Portions |
|---|---|---|---|---|
| YES | YES | YES | NO | 1ST & 2ND |
| YES | YES | NO | YES | 1ST & 2ND |
| YES | NO | YES | YES | 1ST & 4TH |
| YES | YES | NO | NO | 1ST & 2ND |
| YES | NO | NO | YES | 1ST & 4TH |
| NO | YES | YES | YES | 2ND & 3RD |
| NO | YES | YES | NO | 2ND & 3RD |
| NO | NO | YES | YES | 3RD & 4TH |

The table is made on the basis of the following rules.
1. When three mark portions out of four mark portions are detected, the alignment is possible.
2. When the following two mark portions out of the four mark portions are detected, the aligment is possible;
the first mark portion and the second mark portion;

the first mark portion and the fourth mark portion;
the second mark portion and the third mark portion; or
the third mark portion and the fourth mark portion.

3. When the following two mark portions are only detectable, the alignment is not possible, and therefore, the wafer is stepped to expose the next zone:
the first mark portion and the third mark portion; or
the second mark portion and the fourth mark portion.

When the alignment is effected on the basis of only two mark portions, the relative position between the mask 1 and the wafer 4 is changed in the X-direction and Y-direction to remove the deviations ΔX and ΔY which are obtained in accordance with the equations which will be described hereinafter. No correction in the rotational direction (θ) is effected. The correction in the rotational direction can be omitted because of the finding that the recent stepping mechanism of the stage is so reliable that the rotational error is hardly introduced by one or two rectilinear stepping movements, and therefore, for the zones just after the zone in which the corrections are made all for the X-direction, Y-direction and θ-direction, the deviation in the rotational direction (θ) falls in the tolerance if the deviations only in the X-direction and Y-direction are corrected.

The deviations ΔX and ΔY are determined when the detectable mark portions are combined, in the following manner.

1. The first mark portion and the second mark portion:
The above equations (1) and (2).
2. The second mark portions and the fourth mark portions:
The above equations (2) and (3).
3. The first mark portion and the fourth mark portion:

$$\Delta X = (W1 - W2 + W3' - W4')/4 \quad (6)$$

$$\Delta Y = (W1 - W2 - W3' + W4')/4 \quad (7)$$

4. The second mark portion and the third mark portion:

$$\Delta X = (-W1' + W2' - W3 + W4)/4 \quad (8)$$

$$\Delta Y = (-W1' + W2' + W3 - W4)/4 \quad (9)$$

Figure 6:
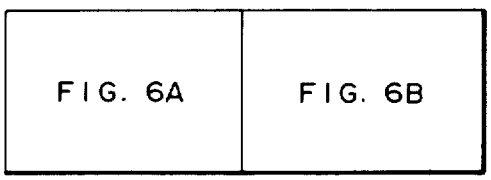
FIGS. 6, 6A and 6B are a block diagram of the circuit according to another embodiment of the present invention.
Figure 7:
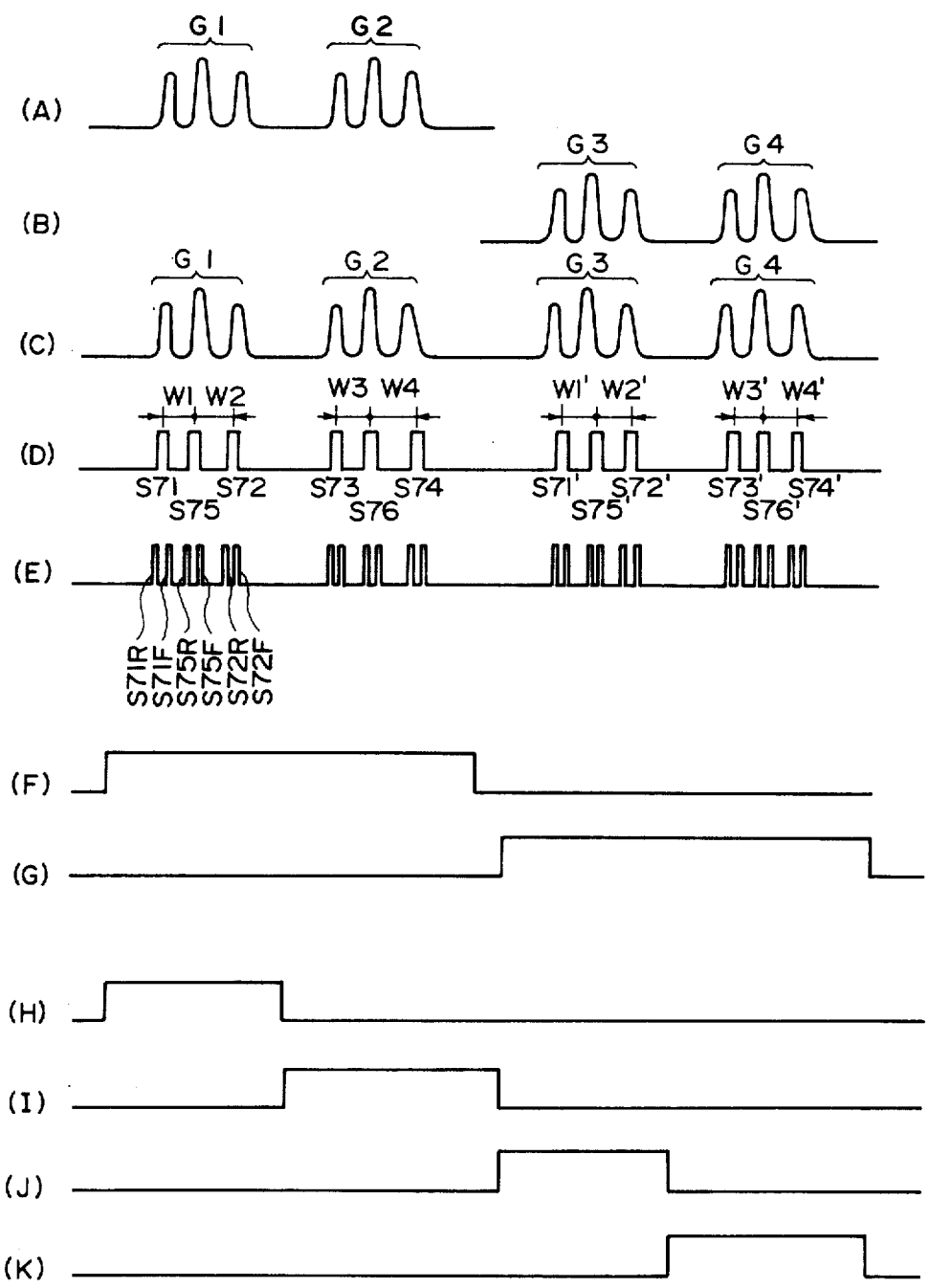
FIG. 7 illustrate wave forms of signals.

FIG. 6 is a block diagram of a circuit for discriminating whether the detection signals from the four mark portions are proper or not, and for memorizing the results. FIG. 7 illustrates wave forms of the signal for explaining the operations of various parts of the circuit shown in FIG. 6.

In FIG. 6, the photodetectors 47 and 47' for detecting the alignment marks are shown as the same elements by the same reference numerals in FIG. 2A. From the photodetector 47, the signal is produced which has the waveform shown by (A) in FIG. 7. Similarly, from the photodetector 47', the signal is produced by the alignment mark portions, which has the waveforms shown by (B) in FIG. 7. The waveforms indicated by the references G1, G2, G3 and G4 in FIG. 7 (A) and (B) correspond, respectively, to the first, second, third and fourth mark portions.

In FIG. 6, there are shown photodetectors 58 and 58' for detecting synchronization signals which have been shown in FIG. 2A by the same reference numerals. They produce the output shown by (F) and (G) in FIG. 7. The synchronization signal (F) for the left-hand side detection system and the synchronization signal (G) for the right-hand side detection system are introduced into a control/timing generating circuit 101. The control/timing generating circuit 101 is under the control of a microprocessor (not shown) and controls the entire detection circuits which will be described hereinafter.

The control/timing generating circuit 101 controls an analog switch 103 through the control line 102. The control line 102 carries, for example, a left-hand side synchronization signal (F), and the analog switch 103 selects the signals from the left-and detection system and/or the right-hand detection system to produce a combined waveform as shown at (C) in FIG. 7.

The combined signal (C) is amplified by a video amplifier 104 and is cut at a proper slice level and converted to a digitalized waveform represented by references S71, S75, S72 ... (FIG. 7(D)) by a binary-coding circuit 105. The intervals W1, W2 ... between the bars are represented as the time intervals between the signals S71 and S75, between S75 and S72 ... and so on. The digitalized waveform (D) of FIG. 7 is introduced into an edge detection circuit 106 so that the edges of the waveform is detected and that the waveform shown in (E) of FIG. 7 is formed.

The leading edge of the signal S71 is converted to a leading edge of a signal S71R, and the trailing edge of the signal S71 to the trailing edge of the signal S71F. Therefore, the bar intervals W1 is obtained as (S75R+S75F)/2 − (S71R+S71F)/2. The edge pulses (E) shown in FIG. 7, is inputted as clock pulses of counters 107, 108, 109 and 110 for counting the pulse number obtained from each of the mark portions. The control/timing generating circuit 101 generates a mark portion selecting signals (H), (I), (J) and (K) on the basis of the synchronization signals (F) and (G).

The mark portion selecting signals (H), (I), (J) and (K) are the signals representing the selection of the first, the second, the third and the fourth mark portions, respectively, and they control the counters 107, 108, 109 and 110. More particularly, the counters 107, 108, 109 and 110 count the number of pulses produced by the first mark portion, the second mark portion, the third mark portion and the fourth mark portion, respectively.

The pulse intervals S75R, S75F, S71R and S71F ... are measured by counting the sampling pulses which have a pulse interval sufficiently shorter than the pulse invervals S75R, S75F and S71R ... and so on.

The sampling pulses are produced by the control/timing generting circuit 101 and transmitted through the signal line 111 to interval counters 112, 113, 114 and 115 as a clock input. The interval counters 112, 113, 114 and 115 count the sampling pulses only during the aforementioned mark portion selecting signals (H), (I), (J) and (K), respectively, from the leading edges of the selection signals.

On the other hand, the edge pulses (E) are transmitted to a write timing circuit 116, which produces write signal for interval memories 117, 118, 119 and 120.

A write timing circuit 101 is controlled by the control/timing generating circuit 101 to generate write signals during the measurement operation, but to produce read signals after the completion of the measurement operation. The interval memories 117, 118, 119 and 120 are random access memories of 16 bits × 6 of an input-output separate type. The reading and the writing thereof is controlled by the write timing circuit 116. The chip selection signals are applied from the control/timing generating circuit 101. The address signals are controlled by the output data of the counters 107, 108, 109 and 110 during the measurement operation, and by the address bus 135 of the microcomputer after the completion of the measurement operation.

Accordingly, upon the completion of the measurement, the interval memories 117, 118, 119 and 120 store the pulse data as shown in Table 2.

TABLE 2

| ADDRESSES | INTERVAL MEMORIES | | | |
|---|---|---|---|---|
| | 117 | 118 | 119 | 120 |
| 1 | S71R | S73R | S71'R | S73'R |
| 2 | S71F | S73F | S71'F | S73'F |
| 3 | S75R | S76R | S75'R | S76'R |
| 4 | S75F | S76F | S75'F | S76'F |
| 5 | S72R | S74R | S72'R | S74'R |
| 6 | S72F | S74F | S72'F | S74'F |

After the termination of the measurement operation, the microprocessor (not shown) accesses the interval memories 117, 118, 119 and 120 through the address bus 135 and the buffers 130, 131, 132 and 133, and the data thereof are taken into the microprocessor through the buffers 126, 127, 128 and 129 and the data bus 134.

The data of the pulse numbers of the mark portions stored in the counters 107, 108, 109 and 110 are also introduced in the microprocessor through the buffers 122, 123, 124 and 125. If the number of the pulses is six, the detection of the mark portions is discriminated (that is, "YES" in Table 1), whereas, if the number is other than six, no mark portion is discriminated (that is, "NO", in Table 1).

Figure 8:
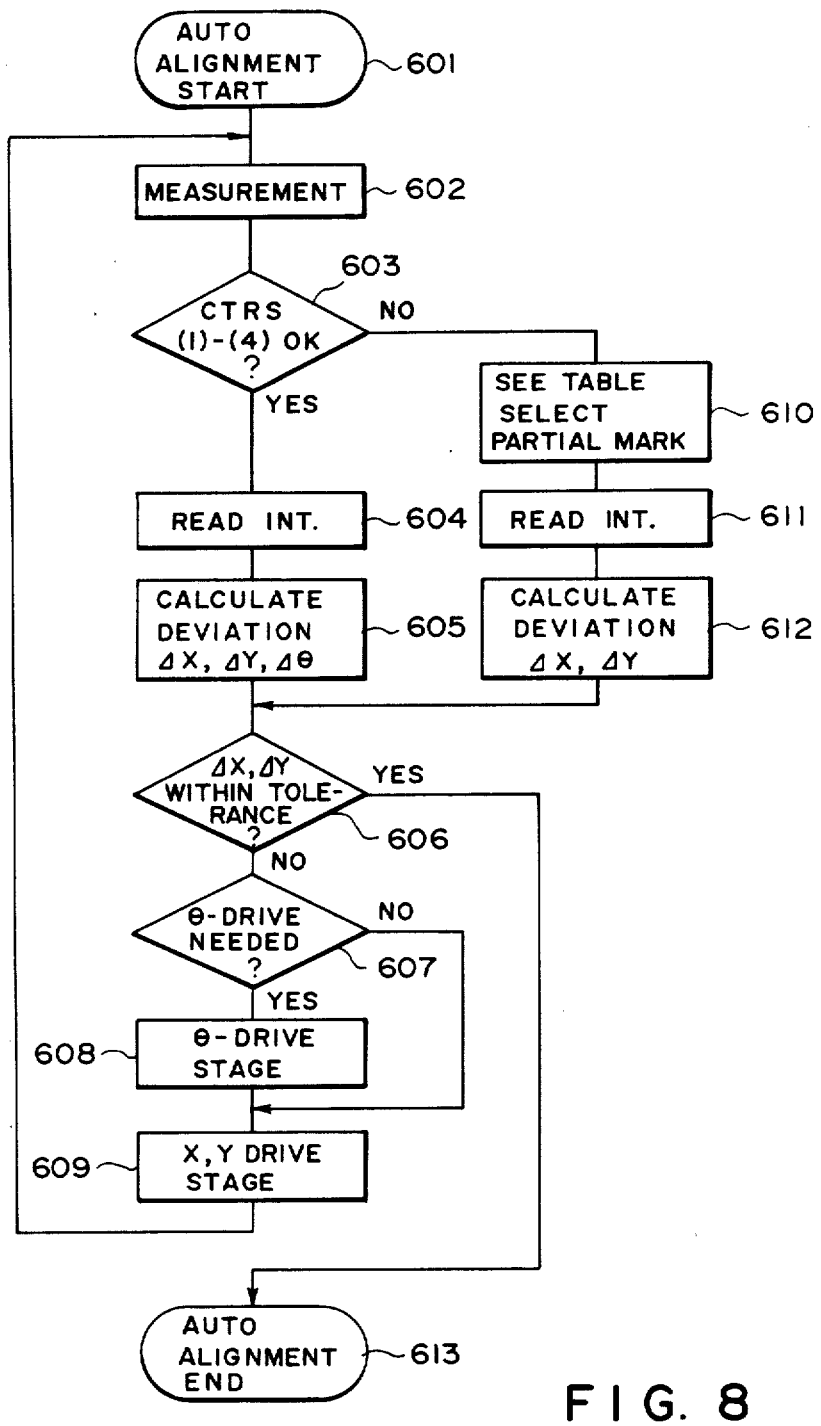
FIG. 8 is a flow chart showing the process of alignment according to the second embodiment of the present invention.

FIG. 8 is a flow chart showing the operations of the automatic alignment system according to the second embodiment of the present invention.

The automatic alignment starts at step 601 in this Figure. At step 602, the mark portions are detected by the scanning with the laser beam.

During this detection or measurement, as explained with respect to FIGS. 6 and 7, the measurement is made as to the pulse number and the pulse interval for each of the mark portions. After the termination of the measurement operation, the contents of the counters 107, 108, 109 and 110 (FIG. 6) are accessed at step 603, and an inspection is made as to whether each individual counter has the number "6". If so, that is, all the counters have the number "6", it is discriminated that all of the four mark portions are properly detected. At step 604, the contents of the interval memories 117, 118, 119 and 120 are read out, and at the next step, that is, step 605, the positional deviations are calculated in accordance with the aforementioned equations (1)–(5). In this case, the deviations $\Delta X$ and $\Delta Y$ in the X-direction and the Y-direction, respectively, are determined as the average values of the left-hand mark deviation and the right-hand mark deviation, as follows:

$$\Delta X = (\Delta XL + \Delta XR)/2$$

$$\Delta Y = (\Delta YL + \Delta YR)/2$$

If the counts of the counters 107, 108, 109 and 110 are not all "6", at step 603, that is, if it is discriminated that there is a non-detectable mark portion, the sequence goes to step 610, where a table corresponding to Table 1 is referred to, so as to select, out of the mark portions which have been detected, the proper mark portions which can allow the calculation of the positional deviation. At step 611, interval memories corresponding to those mark portions, are selected, and the data thereof are read, and then, the positional deviations are calculated by a known method using the aforementioned equations (6), (7), (8) and (9), at step 612.

Whether or not the mark portions are detected, the determined deviations $\Delta X$ and $\Delta Y$ obtained through the steps 604 and 605 or by the steps 610 to 612, are compared with the predetermined tolerance at step 606.

If they are within the tolerance, the sequence goes to the step 613, and the alignment operation ends.

If the deviations are not within the tolerance, the alignment operation is performed. If the four mark portions have all been detected, the drives in the X-direction, Y-direction and $\theta$-direction are carried out. However, if not all four mark portions have not been detected, the drives only in the X-direction and the Y-direction are carried out. To do this, at step 607 a discrimination is made as to whether $\theta$-drive is necessary or not. If so, the $\theta$-drive is effected at step 608. If not, the sequence goes to step 609. In either of the cases, the positional corrections in the X-direction and the Y-direction are performed at step 609 to cause the relative movement between the mask 1 and the wafer 4. The relative movement in the X-direction, Y-direction or $\theta$-direction may be effected by driving the mask stage 22 or the wafer stage 5. After the completion of the stage drive, the sequence goes back to the step 602, and the mark interval measurement operation is repeated until the positional deviation is found to be within the tolerance, by way of the steps from 602 to 609.

In the foregoing embodiment, the number of the detected bars is counted, and simultaneously, the bar intervals are memorized. However, two modes are used respectively for counting the bars and for taking the bar interval information on the basis of the proper mark portions. The alignment marks are scanned by a spot beam, and the beams scatteredly reflected by the alignment marks are used for the detection of the alignment marks. However, images of the alignment marks are formed, which are scanned by a slit or an image pick-up elements. Those embodiments of the present invention may be used with the alignment between the mask 1 and the wafer 4 and also usable with a circuit inspecting machines or the like wherein the wafer 4 is aligned with respect to the inspecting machine.

As described in the foregoing, according to this embodiment of the present invention, even if the alignment marks are partly damaged or failed so that proper detection is not possible thereof, the deviation between the mask 1 and the wafer 4 is corrected by the use of the combination of the selected ones or portions of the remaining alignment marks. By doing so, the zones of the wafer 4 which conventionally have been given up can be aligned automatically. And, the waste time can be saved which is required to attempt to obtain the complete mark information until the judgement is made that it has to be given up after all. Additionally, the percentage of success in alignment operation is remarkably increased so that, when used with a step-and-repeat apparatus, the number of valid chips obtainable from one wafer is increased. Thus, the throughput is highly improved.

A third embodiment of the present invention will now be described. FIG. 9 illustrates the major portions of a step-and-repeat apparatus with alignment mark detection signals according to the third embodiment of the present invention. Since the arrangement shown in FIG. 9 is similar to that shown in FIG. 2A except for the portions which will be described hereinafter, the detailed explanation of those similar portions are omitted for the sake of simplicity by assigning the same reference numerals to the corresponding elements.

The apparatus includes a control device for the wafer stage 5 and the mask stage 22, of which the operations will be described in detail in conjunction with FIG. 10. The apparatus further includes a control circuit C for controlling various operations, and memory circuit M which stores a predetermined arrangement of shots and the order of stepping operations. The memory circuit M, at a later stage of the sequence, will store an amount of correction for removing the positional deviation. A signal selection circuit S selects one or both of the detection signals from the photodetectors 47 and 47' in accordance with the shot arrangement and the stepping action order stored in the memory circuit M. A processing circuit O is effective to determine the pitch error and the amount of movement in the X-direction, Y-direction and θ-direction which are needed for the alignment operation, from the two series of the detection system. Based on these, the mask stage 22 is displaced into the aligned position by the first driving circuit D1, and simultaneously, the pitch error is stored in the memory circuit M. When one of the detection signals is selected, the pitch error stored in the memory circuit M is read out and used to correct the determination obtained by the one detection signals. A second driving circuit D2 step-moves the wafer stage 5 in accordance with the shot arrangement and the order of the stepping action stored in the memory circuit M. In the event that a proper detection signal is not obtained from the photodetector 47 or 47', that is, only one of the marks or only a part of the marks is detected, the signal selection circuit S discriminates to that effect, and the suitable equations which have been described hereinbefore are used for the calculation.

Referring to the equations stated in the foregoing paragraphs, the difference $\Delta XR - \Delta XL$, which is the difference between the deviation $\Delta XR$ in the X-direction detected by the right-hand detection system and the deviation $\Delta XL$ in the same direction but the detected by the left-hand detection system, has to be zero, since the distance between the left-hand mark and the right-hand mark of the mask is equal to the distance between the left-hand mark and the right-hand mark of the wafer 4. Actually, however, it is sometimes not zero. One half of the difference, that is, $(\Delta XR - \Delta XL)/2$ is called a "pitch error".

The major reasons for the occurrence of the pitch error are:
(1) The reduction and expansion of the wafer 4 or the mask 1;
(2) The warp of the wafer 4;
(3) The accuracy of the mask 1;
(4) The difference in the magnification of the exposure from the previous exposure step, or the distortion;
(5) The lens effect of the resist layer, and others.

The amount of the pitch error is taken into account when the deviations are determined based on both the left-hand detection system and the right-hand detection systems. And then, the discrimination is made whether the deviation is within the tolerance or not, so that the existence of the pitch error is not a problem in the execution of the alignment operation.

The automatic alignment operation based on partial marks covers the case where the mark only at one side is usable because the zone to be exposed is at the marginal area of the wafer 4 and the case where a part of the alignment marks is damaged or failed. In either of the cases, the automatic alignment operation is effected by the following combination of the mark portions:
(1) The first mark portion and the second mark portion;
(2) The third mark portion and the fourth mark portion;
(3) The first mark portion and the fourth mark portion; and
(4) The second mark portion and the third mark portion.

The positional deviations $\Delta X$ and $\Delta Y$ are determined in the above four respective cases by the following equations:
Case (1) enumerated above . . . equations (1) and (2);
Case (2) enumerated above . . . equations (3) and (4);
Case (3) enumerated above:

$$\Delta X = (W1 - W2 + W3' - W4')/4 \qquad (6)$$

$$\Delta Y = (W1 - W2 - W3' + W4')/4 \qquad (7)$$

Case (4) enumerated above:

$$\Delta X = (-W1' + W2' - W3 + W4)/4 \qquad (8)$$

$$\Delta Y = (-W1' + W2' + W3 - W4)/4 \qquad (9)$$

In any of these cases, the pitch error $(\Delta XR - \Delta XL)/2$, which is one half of the difference between the deviation in the X-direction measured by the left-hand side detection system and the deviation in the same direction but detected by the right-hand detection system, can not be detected. Therefore, if the measurement or detection is made on the basis of the partial mark with respect to a wafer 4 which involves a pitch error, an alignment error due to the pitch error results.

This point has particularly been noted by the present invention. That is, it is intended to make it possible to execute the aligment operation in consideration of the pitch error even when the detection or the measurement is based only on the partial marks. The present invention is based on the finding that the amount of the pitch error is almost the same in the adjacent zones, so that the deviation $\Delta X$ in the X-direction is corrected by the amount of the pitch error obtained from a zone which is in the neighbourhood of the zone in question. The corrected deviation is used for the alignment.

Figure 10:
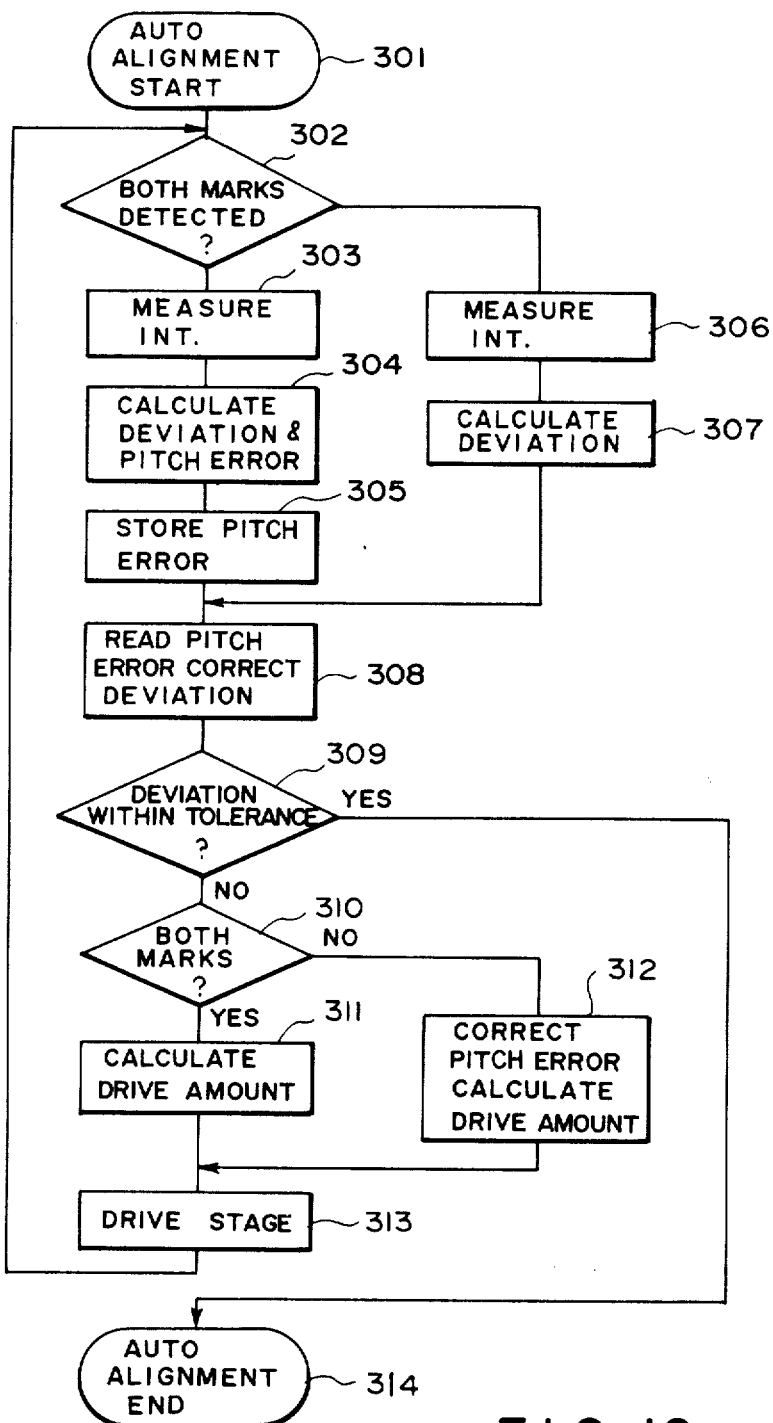
FIG. 10 is a flow chart showing the operation of the apparatus according to the third embodiment of the present invention.

FIG. 10 is a flow chart for explaining the operations of the automatic alignment system employed in the semiconductor circuit manufacturing apparatus according to the embodiment of the present invention. The automatic alignment operation starts at step 301. At step 302, the discrimination is made as to the zone to be aligned can be aligned with both of the left-hand and right-hand marks or not.

If so, the intervals between twelve alignment mark elements are measured at step 303. After the measurement completes, the deviations at the left-hand and right-hand sides are calculated by the equations (1), (2), (3) and (4). Also, the pitch error $EP = (\Delta XR - \Delta XL)/2$ is calculated, and at step 305, the pitch error EP is stored in a memoroy. If the result of the discrimination at the step 302 is negative, the sequence goes to step 306 from the step 302. At the step 306, the interval measurement is effected with the mark at one side. After the completion of the measurement operation, the deviation is calculated at step 307 by the equations (1) and (2) when the mark is detected by the left-hand detection system, and by the equations (3) and (4) when the mark is detected by the right-hand detection system.

Then, whether or not the measurement is effected with both of the marks or not, the data of the pitch error stored in the memory is read out at step 308. The read pitch error is, therefore, the pitch error of the current shot or zone upon the both-mark measurement, and is the pitch error obtained at the latest both-mark measurement operation when the current measurement is effected with one mark. The measured deviation in the X-direction is corrected by one of those pitch errors so that the deviation of the left-hand detection system is $\Delta XL + EP$ and that the deviation of the right-hand detection system is $\Delta XR + EP$. This is so, when the measurement is effected with one mark so that the same correction is made to the deviation measured from either one of the left-hand and right-hand marks.

At step 309, the discrimination is made as to whether the corrected deviation is within the tolerance or not.

If the tolerance to the deviations in the X-direction and the Y-direction is expressed as a regular square on coordinates, then the tolerance is represented by the following:

$$\Delta XL + EP \leq T \quad (10)$$

$$\Delta XR + EP \leq T \quad (11)$$

$$\Delta YL \leq T \quad (12)$$

$$\Delta XR \leq T \quad (13)$$

These conditions of the tolerance are applicable also to the measurement on the basis of one side mark, that is, the inequalities (10) and (12) for the left-hand mark, and the inequlities (11) and (13) for the right-hand mark.

If the measured deviations are not within the tolerance, namely, they do not meet the inequalities (10), (11), (12) and (13), the sequence goes to step 310, where the discrimination is made as to the measurement is based on both of the marks or not. If so, the amount of the stage drive is calculated by the step 311. The amounts DX and DY of the drive in the X-direction and the Y-direction are obtained by the following:

$$DX = -(\Delta XL + \Delta XR)/2 \quad (14)$$

$$DY = -(\Delta YL + \Delta YR)/2 \quad (15)$$

If the measurement is made on the basis of one side mark, the sequence goes to step 312, where the amount of the stage drive is calculated with the pitch error correction according to this embodiment of the present invention. The amounts of the drive are determined, when the right-hand mark only is used, as follows:

$$DX = -(\Delta XR - EP) \quad (16)$$

$$DY = -\Delta YR \quad (17)$$

When the left-hand mark only is used, the amounts of the drive are:

$$DX = -(\Delta XL + EP) \quad (18)$$

$$DY = -\Delta YL \quad (19)$$

Thus, the correction of the pitch error is made also when the measurement is based only on one side mark, so that the accurate alignment is possible.

After the calculation of the drive amounts is accomplished, the sequence goes to step 313, where the stage is driven. Then, the sequence goes back to the step 302, and the measurement operation is repeated. This loop of the sequence is repeated until the deviation becomes within the tolerance.

When the deviations within the tolerance are detected, the sequence goes to step 314 from step 309, and therefore, the automatic alignment ends.

The explanation with FIG. 10 has been made when the mark only on one side has to be used, due to the shot position, but the pitch error correction can be made in the same manner also when a portion of a mark is not detectable, as in the case of the foregoing embodiment. Also, in the embodiment described with FIG. 10, the correction of the pitch error is made on the bases of the pitch error measured at the latest both-mark measurement, but it is a possible alternative that an average of the latest several shot data are used. As described in the foregoing, according to this embodiment of the present invention, the correction both by the pitch error and the rotational deviation is made for the alignment when the alignment has to be made on the basis of only one side mark, and therefore, a highly accurate alignment operation is possible.

Next, the fourth embodiment of the present invention will be described. This embodiment also deals with the case where both of the deviation $\Delta YR$ in the Y-direction with the use of the right-hand detection system and the deviation $\Delta YL$ in the Y-direction with the use of the left-hand detection system, are not detected. In this case, the rotational deviation $\Delta \theta$ can not be obtained by the equation (5). Therefore, at the first shot of the wafer 4, for which the alignment has to be made with the use only of a part of the mark, the accuracy in the alignment is not high because the correction by the pitch error and the correction of the rotational deviation can not be made. The decrease of the accuracy can be avoided by correcting the partial mark alignment on the basis of the previous both-mark alignment. Noting this, the present invention is intended to use both of the alignment marks for the first alignment. By doing so, the decrease of the alignment accuracy for the first shot where the alignment has to be made on the basis of a partial alignment mark is prevented. The major sequences of the operation according to this embodiment is explained.

(1) If the shot arrangement predetermined by the operator is such that the first shot is so located that only one mark is usable, the wafer 4 is stepped so that the first shot is made to such a zone that both of the marks are usable. Then, the automatic alignment operation is executed for that shot. Only then, or after all the other shot are executed, the first shot set by the operator is performed.

(2) In the event that the automatic alignment is not possible on the basis of both of the marks in the shot selected in the foregoing paragaph because of, for example, some failure in the mark thereof, then no one-mark measurement is effected, but the wafer is further stepped until the zone where both-mark measurement is possible is reached. Then, the alignment operation is implemented.

Figure 11:
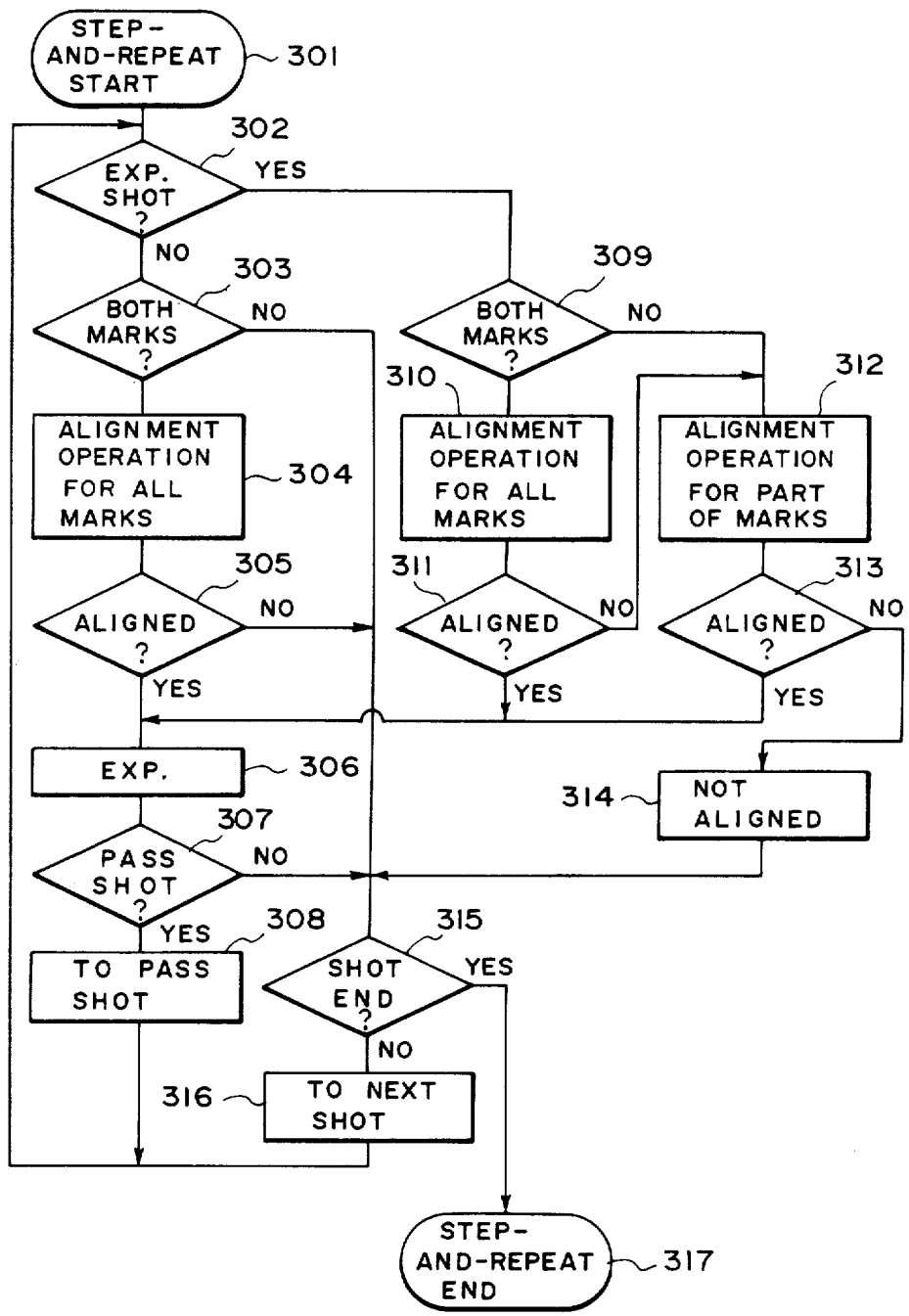
FIG. 11 is a flow chart showing the operation of the apparatus according to the fourth embodiment of the present invention.

FIG. 11 is a flow chart for explaining in detail the operation of the semiconductor circuit manufacturing device according to the fourth embodiment of the present invention.

First, the wafer 4 is fed to below the projection lens system. At step 301, the step-and-repeat operation starts. At step 302, the discrimination is made as to whether one or more exposure shots have been executed or not. Since, in the first shot operation, no exposure operation has been made previously, the sequence goes to step 303, where the discrimination is made on the basis of the information of the shot arrangement as to the first shot is to the zone where both marks are usable or not.

Here, the shot arrangement will be explained in conjuncton with FIG. 12, which shows a plan view of the wafer 4. Each of the areas P is the zone of the wafer 4 covered by one shot of the exposure. The one zone contains four chips, each of which is defined as an area T. The numerals given at the lower bottom portion of each of the zones indicate the shot number. The automatic alignment marks for the second shot or zone, for example, are located at the position A (right-hand mark) and the position B (left-hand mark). As will be understood from this Figure, the light mark position A' for the first shot is not on the wafer surface, so that the alignment is executed on the basis only of the left-hand mark.

Therefore, in the case of the shot arrangement as shown in FIG. 12, the first shot is such that the one-mark alignment operation is to be made. For the reason described hereinbefore, the alignment operation is not executed for the first shot zone, and the sequence directly goes to step 315 from the step 303 (FIG. 11). At the step 315, the discrimination is made as to whether all the shots have been executed or not. Since, no exposure shot has been made as yet, the sequence goes to step 316, where the wafer stage step-moves the wafer to the next shot, and the sequence goes back to the step 302. In other words, if the first shot zone is a one-mark alignment zone, the wafer is immediately stepped to the second step. In the example of FIG. 4, the both-mark alignment is possible in the second shot, so that the sequence goes through step 302 to step 303. At step 304, the automatic alignment operation is implemented on the basis of both of the marks. After the automatic alignment operation is executed properly, the sequence goes from step 305 to step 306, where a pattern of the mask 1 is printed on the wafer 4 by a predetermined exposure process.

After the exposure is accomplished, the sequence goes to step 307, where the discrimination is made as to whether there is a skipped shot (an exposed) before the present shot. In this example, the first shot has been skipped, the sequence goes to step 308, where the wafer stage is driven to locate the first shot zone under the objective lens system. At this time, there is now a zone which has been exposed before the first shot zone, and the usable alignment marks are not on both sides, and therefore, the sequence goes through step 302 and step 309 to step 312. At step 312, the information of the positional deviation obtained from the one-mark of the first shot is corrected on the basis of the information obtained during the second shot alignment operation, that is, the information of the pitch error and the rotational deviation thereof. And then, the alignment for the first shot is carried out.

If the both-alignment-mark operation is possible for the first shot, and if the automatic alignment operation has been performed for the first shot on the basis of both of the marks, there is no skipped shot, so that the sequence goes from the step 307 to steps 315 and 316. The stage steps to the next shot position. If, at the step 304, the both (full)mark automatic alignment is not possible due to a failure or damage of the alignment mark, the automatic alignment operation based on the partial mark is not performed for the shot, and the sequence goes from the step 305 to steps 315 and 316, that is to the next shot.

The foregoing sequential operations are summarized as follows:

(1) If the first shot is to a one-mark alignment zone, and if the second shot is to a both-mark alignment zone,
shot 2 - shot 1 - shot 3 - shot 4 . . .
(2) If the first shot is to a one-mark alignment zone, and if a both-mark alignment is not possible to the second shot,
shot 3 - shot 1 - shot 2 - shot 4 . . .
(3) If the first shot is to a both-mark alignment zone,
shot 1 - shot 2 - shot 3 - shot 4 . . .

In any of those cases, the zone which is first exposed has usable alignment marks at the both sides.

After one or more exposures have been accomplished, the sequence goes from the step 302 to the step 309. Then, on the basis of the predetermined shot arrangement information, the discrimination is made as to whether the current zone has the alignment marks at the both sides or whether it has the alignment mark only at one side. Then, at step 310, the alignment operation is performed on the basis of both of the marks, and at step 312, the alignment is effected with only one mark.

In the event that, at step 310, the both-mark alignment operation is not possible due to, for example, some failure of the alignment mark, the sequence goes from the step 311 to a step 312, where an automatic alignment operation is implemented on the basis of the partial mark which is usable. If the automatic alignment on the basis of the partial mark or a mark on one side is not possible, the sequence goes to step 314, where the inability of the alignment is displayed on a display panel by characters or the like. In this case, the wafer 4 may be stepped to the next shot without exposing the zone of the wafer where the alignment is not possible, or the operator can manually align it.

When the full-mark automatic alignment or a partial-mark automatic alignment is possible, the sequence goes to step 310 and step 311, or to step 312 and step 313, and to step 306. Thus, the exposure operation is effected. In this manner, the exposure shot is effected to all of the zones of the wafer. Then the sequence goes to step 317, where the step-and-repeat operation ends.

As described in the foregoing, according to this embodiment of the present invention, the number of valid chips from one wafer is increased. In addition, since the first alignment operation is executed to such a zone of the wafer where plural alignment marks (both-marks) are all usable, the subsequent zones where only a part of the alignment marks are not usable can be aligned with high precision.

While the invention has been described with reference to the structures disclosed herein, it is not confined to the details set forth and this application is intended to cover such modifications or changes as may come within the purposes of the improvements or the scope of the following claims.

What is claimed is:

1. An alignment device for bringing, one by one, different zones on an object into a predetermined positional relation with a reference by use of marks provided for the zones, respectively, said device comprising:

driving means for moving the object so that the different zones are placed, one by one, in an alignment region in which each of the zones is to be brought into the predetermined positional relation with the reference;

detecting means for detecting a said mark associated with one of the zones which is placed in said alignment region by said driving means, said detecting means producing an output;

discriminating means for discriminating a state of existence of the said mark associated with the one zone placed in said alignment region; and aligning means for bringing the one zone placed in said alignment region into the predetermined positional relation with the reference, wherein said aligning means is adapted to execute a predetermined aligning operation in response to the output of said detecting means when the said mark associated with the one zone is discriminated as being proper by said discriminating means and wherein said aligning means is adapted to execute a portion of the predetermined aligning operation in response to the output of said detecting means when the said mark associated with the one zone is discriminated as being partially defective by said discriminating means.

2. A device according to claim 1, wherein each of said marks provided for said zones, respectively, has a first mark component and a second mark component and wherein said aligning means executes the predetermined aligning operation in response to the output of said detecting means when the first and second mark components are discriminated as being proper by said discriminating means while said aligning means executes the portion of the predetermined aligning operation in response to the output of said detecting means when one of the first and second mark components is discriminated as being proper but the other mark is discriminated by said discriminating means as being at least partially defective.

3. A device according to claim 1, wherein the state of existence of each of the marks associated with said zones, respectively, is determined by arrangement of said zones on the object and wherein said discriminating means has stored therein the state of existence of each of the marks, such that said discriminating means discriminates the state of existence of the said mark associated with the one zone on the basis of information stored therein.

4. A device according to claim 1, wherein said discriminating means discriminates the state of existence of the said mark associated with the one zone on the basis of the output of said detecting means.

5. A device according to claim 1, wherein each of the marks associated with said zones, respectively, has a first mark component and a second mark component and wherein said aligning means is adapted to determine the amount of a pitch error between the first and second mark components of the said mark associated with the one zone on the basis of the output of said detecting means, when the said mark associated with the one zone discriminated by said discriminating means as being proper.

6. A device according to claim 5, wherein, when the said mark associated with the one zone is discriminated by said discriminating means as being partially defective, said aligning means is adapted to determine the amount of the pitch error between the first and second mark components of the said mark associated with the one zone on the basis of an amount of the pitch error related to a said zone which is in the neighbourhood of the one zone and which has a said mark discriminated by said discriminating means as being proper.

7. A device according to claim 1, wherein, when the object is to be first processed by said device, said aligning means is aranged to first bring into the predetermined positional relation with the reference, a said zone having a said mark which is discriminated by said discriminating means as being proper.

8. A device according to claim 1, further comprising means for projecting a pattern on to a said zone having been brought into the predetermined positional relation with the reference in said alignment region.

9. A device according to claim 8, wherein said driving means is adapted to move the object so as to place a said zone, other than the one zone, in said alignment region after the pattern projection onto the one zone by said projecting means is completed.

10. A device according to claim 9, wherein said driving means is adapted to move the object in first and second directions and wherein said aligning means is adapted to adjust the positional relation of the one zone with the reference in the first and second directions and in a rotational direction with respect to an axis perpendicular to a plane containing the first and second directions, in response to the output of the said detecting means, when the said mark associated with the one zone is discriminated by said discriminating means as being proper.

11. A device according to claim 10, wherein said aligning means is adapted to adjust the positional relation of the one zone with the reference only in the first and second directions, in response to the output of said detecting means, when the said mark associated with the one zone is discriminated by said discriminating means as being partially defective.

12. A device according to claim 9, wherein each of said marks provided for said zones, respectively, has a first mark component and a second mark component, wherein said detecting means has a first detecting system and a second detecting system for detecting, respectively, the first and second mark components of the said mark associated with the one zone, independently of each other, and wherein said aligning means is adapted to detect a positional deviation of each of the first and second mark components of the said mark with respect to the reference and in first and second directions, on the basis of an output of the corresponding one of said first and second detecting systems, and to detect a positional deviation of the said mark associated with the one zone in a rotational direction about an axis perpendicular to a plane containing the first and second directions on the basis of the outputs of said first and second detecting systems, when the said mark associated with the one zone is discriminated by said discriminating means as being proper.

13. A device according to claim 12, wherein said aligning means is adapted to detect the positional deviation of the one zone with respect to the reference and in the first and second directions on the basis of at least one of the output of said first and second detecting systems, when the said mark associated with the one zone is discriminated by said discriminating means as being partially defective.

* * * * *

UNITED STATES PATENT AND TRADEMARK OFFICE
CERTIFICATE OF CORRECTION

PATENT NO. : 4,719,357            Page 1 of 4
DATED : January 12, 1988
INVENTOR(S) : NAOKI AYATA, ET AL.

It is certified that error appears in the above-identified patent and that said Letters Patent is hereby corrected as shown below:

AT [56] IN THE REFERENCES

Foreign Patent Documents, "1577025    10/1908    United Kingdom." should read --1577025    10/1980    United Kingdom.--.

COLUMN 1

Line 54, "aligment" should read --alignment--.
    Line 57, "referece" should read --reference--.

COLUMN 4

Line 43, "f-θobjective" should read --f-θ objective--.

COLUMN 5

Line 10, "crosssection" should read --cross-section--.
    Line 32, "numerals" should read --numeral--.
    Lines 51-52, "produces" should read --produce--.
    Line 56, "S71." should read --S71,--.

COLUMN 6

Line 65, "aligment" should read --alignment--.

COLUMN 7

Line 17, "deviation" should read --deviations--.
    Line 54, "change" should read --changes--.
    Line 68, "mirror" should read --mirrors--.

UNITED STATES PATENT AND TRADEMARK OFFICE
CERTIFICATE OF CORRECTION

PATENT NO. : 4,719,357

DATED : January 12, 1988

INVENTOR(S) : NAOKI AYATA, ET AL.

It is certified that error appears in the above-identified patent and that said Letters Patent is hereby corrected as shown below:

COLUMN 8

Line 26, "Xnamed" should read --named--.
Line 36, "marks portion" should read --mark portions--.
Line 66, "aligment" should read --alignment--.

COLUMN 9

Line 31, "portions" should read --portion--.
Lines 31-32, "portions:" should read --portion:--.

COLUMN 10

Line 9, "left-and" should read --left-hand--.
Line 47, "generting" should read --generating--.

COLUMN 12

Line 13, "not" (first occurrence) should be deleted.

COLUMN 13

Line 41, "but the" should be deleted.

COLUMN 14

Line 38, "aligment" should read --alignment--.
Line 46, "neighbourhood" should read --neighborhood--.
Line 52, "to the" should read --to whether the--.
Line 61, "memoroy." should read --memory.--.

UNITED STATES PATENT AND TRADEMARK OFFICE
CERTIFICATE OF CORRECTION

PATENT NO. : 4,719,357
DATED : January 12, 1988
INVENTOR(S) : NAOKI AYATA, ET AL.

It is certified that error appears in the above-identified patent and that said Letters Patent is hereby corrected as shown below:

COLUMN 15

Line 35, "inequlities" should read --inequalities--.
    Line 39, "to the" should read --to whether the--.

COLUMN 16

Line 51, "shot" (first occurrence) should read --shots--.
    Line 55, "paragaph" should read --paragraph--.

COLUMN 17

Line 5, "to the" (first occurrence) should read --to whether the--.
    Lines 7-8, "conjuncton" should read --conjunction--.
    Line 17, "light" should read --right--.
    Line 28, "Since," should read --Since--.

COLUMN 18

Line 16, "usable" should read --the usable--.
    Line 16, "the" should be deleted.

COLUMN 19

Line 59, "discriminated" should read --is discriminated--.

UNITED STATES PATENT AND TRADEMARK OFFICE
CERTIFICATE OF CORRECTION

PATENT NO. : 4,719,357          Page 4 of 4

DATED : January 12, 1988

INVENTOR(S) : NAOKI AYATA, ET AL.

It is certified that error appears in the above-identified patent and that said Letters Patent is hereby corrected as shown below:

COLUMN 20

Line 2, "neighbourhood" should read --neighborhood--.
   Line 7, "aranged" should read --arranged--.
   Line 27, "the" (second occurrence) should be deleted.

Signed and Sealed this

Fifth Day of July, 1988

Attest:

DONALD J. QUIGG

*Attesting Officer*        *Commissioner of Patents and Trademarks*